United States Patent
Furuta et al.

(10) Patent No.: US 7,180,843 B2
(45) Date of Patent: Feb. 20, 2007

(54) INFORMATION RECORDING AND REPRODUCTION APPARATUS, OPTICAL DISK APPARATUS AND DATA REPRODUCTION METHOD

(75) Inventors: Satoshi Furuta, Kato (JP); Katsuhiko Fukuda, Kato (JP); Akihiro Itakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 659 days.

(21) Appl. No.: 10/340,752

(22) Filed: Jan. 13, 2003

(65) Prior Publication Data

US 2003/0227851 A1 Dec. 11, 2003

(30) Foreign Application Priority Data

Jun. 7, 2002 (JP) ............................ 2002-166899

(51) Int. Cl.
G11B 5/09 (2006.01)
H03M 13/03 (2006.01)

(52) U.S. Cl. .................... 369/59.22; 714/794

(58) Field of Classification Search .................. None
See application file for complete search history.

(56) References Cited

U.S. PATENT DOCUMENTS

| | | | | |
|---|---|---|---|---|
| 6,014,411 | A * | 1/2000 | Wang | 375/259 |
| 6,044,116 | A * | 3/2000 | Wang | 375/265 |
| 6,563,877 | B1 * | 5/2003 | Abbaszadeh | 375/242 |
| 6,606,725 | B1 * | 8/2003 | Wang et al. | 714/755 |
| 6,687,205 | B1 * | 2/2004 | Huber | 369/47.19 |
| 6,807,239 | B2 * | 10/2004 | Sugimoto et al. | 375/341 |
| 6,928,599 | B2 * | 8/2005 | Edlis et al. | 714/752 |
| 2001/0050889 | A1 * | 12/2001 | Hattori et al. | 369/59.24 |
| 2002/0057640 | A1 * | 5/2002 | Hattori et al. | 369/59.24 |
| 2002/0174401 | A1 * | 11/2002 | Wang et al. | 714/786 |
| 2003/0007577 | A1 * | 1/2003 | Shiu et al. | 375/341 |
| 2003/0117914 | A1 * | 6/2003 | Kanaoka et al. | 369/47.17 |
| 2003/0174623 | A1 * | 9/2003 | Uchida | 369/59.24 |
| 2003/0226095 | A1 * | 12/2003 | Cameron et al. | 714/792 |

FOREIGN PATENT DOCUMENTS

| | | |
|---|---|---|
| JP | 2001-127647 | 5/2001 |
| JP | 2001-266501 | 9/2001 |
| JP | 2002-9633 | 1/2002 |

OTHER PUBLICATIONS

Schurgers, C. et al., "Energy Efficient Data Transfer and Storage Organization for a MAP Turbo Decoder Module", Proceedings 1999 International Symposium on Low Power Electronics and Design (ISLPED), San Diego, CA, Aug. 16-17, 1999, pp. 76-81.

* cited by examiner

Primary Examiner—William Korzuch
Assistant Examiner—Adam R. Giesy
(74) Attorney, Agent, or Firm—Staas & Halsey LLP

(57) ABSTRACT

An information recording and reproduction apparatus has a turbo decoder that decodes turbo encoded data. The turbo decoder has a number of likelihood ratio calculation units, forward direction path probability calculation units the number of which is less than the number of the likelihood ratio calculation units, and backward direction path probability calculation units the number of which is less than the number of the likelihood ratio calculation units. The likelihood ratio calculation units calculate in parallel the likelihood ratio for each of a plurality of data blocks. The forward direction path probability calculation units time-divisionally calculate probabilities of the forward direction paths for the data blocks. The backward direction path probability calculation units time-divisionally calculate probabilities of the backward direction paths for the data blocks.

10 Claims, 11 Drawing Sheets

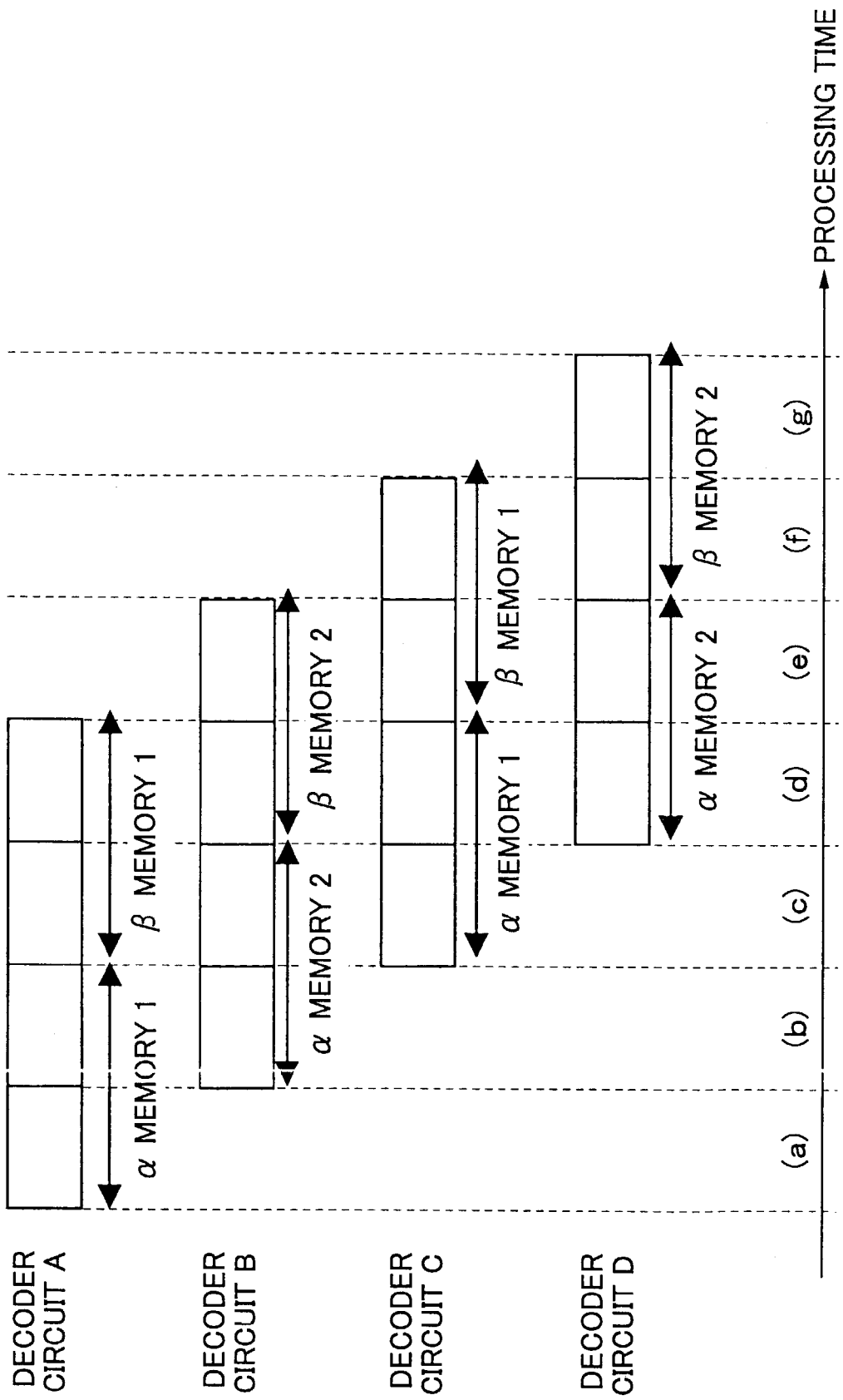

INFORMATION RECORDING AND REPRODUCTION APPARATUS, OPTICAL DISK APPARATUS AND DATA REPRODUCTION METHOD

BACKGROUND OF THE INVENTION

1. Field of the Invention

The present invention generally relates to a method for reproducing data from an optical disk, and especially to a method for reproducing data recorded using a turbo code from a magneto-optical disk.

2. Description of the Related Art

Recently, because recording density of a magneto-optical disk and a data rate to record data to and retrieve data from the magneto-optical disk are being increased, the S/N (signal to noise) ratio of a reproduced signal from the magneto-optical disk is decreased. Therefore, recording and reproducing data using turbo code has been under study.

FIG. 1 shows a block diagram of an example of a turbo encoder according to the prior art. The example of the turbo encoder as shown in FIG. 1 has the first encoder 101, an interleaver 102 and the second encoder 103. The first encoder 101 and the second encoder 103 are recursive systematic convolutional encoders. The interleaver 102 changes a bit arrangement order of an input data bit sequence. As shown in FIG. 1, the input data bit sequence u is convolutional-encoded by the first encoder 101 and the bit arrangement order of the convolutional-encoded bit sequence is changed by the interleaver 102. Next, the output bit sequence supplied from the interleaver 102 is convolutional-encoded by the second encoder 103 and the encoded data bit sequence yk is output from the second encoder 103.

FIG. 2 shows a block diagram of an example of an information recording and reproduction apparatus 200 according to the prior art. The information recording and reproduction apparatus 200 is an optical disk apparatus 200 that uses a magneto-optical (MO) disk 221 as a recording medium. The optical disk apparatus 200 has a recording and reproduction system 202, a write system 201 that writes data on the magneto-optical disk 221 and a read system 203 that reads the recorded data from the magneto-optical disk 221. The recording and reproduction system 202 has an optical head that has an optical beam output unit (for example, a laser diode (LD)) and a photo detector, and a disk drive mechanism 222 that rotates the magneto-optical disk 221 at a predetermined angular speed.

The write system 201 has an encoder 211, a MUX and puncture block 212, an interleaver 213 and an LD driver circuit 214. FIG. 3 shows a block diagram of an example of an encoder 211 of the write system according to the prior art. The encoder 211 is a recursive systematic convolutional encoder that has, for example, delay units 311 and 312 and two exclusive-OR gates 315 and 316. The encoder shown in FIG. 3 generates a parity bit sequence pk that corresponds to a user data sequence uk to be recorded by means of convolutional-encoding the user data sequence uk using the constraint length of three. The MUX and puncture block 212 shown in FIG. 2 combines the user data sequence uk with the parity bit sequence pk generated by the encoder 211 according to a predetermined rule and removes data bits from the combined sequence to generate a punctured coded data bit sequence ai. The removal of the data bits from the combined sequence mentioned above is called a puncture function. The interleaver 213 changes a bit order of the coded data bit sequence ai supplied from the MUX and puncture block 212 based on the predetermined rule to generate a coded data bit sequence ci.

The LD driver circuit 214 controls and drives the optical beam output unit in the recording and reproduction system 202 based on the coded data, bit sequence ci and the optical beam output unit supplies the optical beam. As a result, a signal is written to the magneto-optical disk 221 by means of the optical beam supplied from the optical beam output unit.

The read system 203 of the information recording and reproduction apparatus 200 mainly has an amplifier 231, an AGC (automatic gain controller) 232, a low-pass filter 233, an equalizer 234, an analog to digital converter 235, a memory 236, a repetition decoder 237 and a controller 238. The MO signal 223 supplied from the photo detector in the recording and reproduction system 202 is equalized to approximately be an ideal partial response waveform (PR waveform) by means of the amplifier 231, the AGC 232, the low-pass filter 233 and the equalizer 234. Therefore, the MO reproduction signal 223 from the magneto-optical disk 221 at the output of the equalizer 234 is practically equal to an encoded signal through an partial response (PR) channel. As a result, the encoder 211 in the write system and the practical encoding function by the PR channel, through which PR channel the output of the interleaver 213 is encoded, construct a turbo encoder as shown in FIG. 1. That is to say, the first encoder 101 as shown in FIG. 1 corresponds to the encoder 211 and the MUX and puncture block 212 as shown in FIG. 2, the interleaver 102 as shown in FIG. 1 corresponds to the interleaver 213 as shown in FIG. 2, and the second encoder 103 as shown in FIG. 1 corresponds to the PR channel 250 as shown in FIG. 2.

Furthermore, in the read system 203, the output signal from the equalizer 234 is converted to the digital value (a sampled value) at a predetermined period by the analog to digital converter 235. Then, the sampled values yi which are sequentially output from the analog to digital converter 235 are stored in the memory 236. Next, the sampled values yi stored in the memory 236 are decoded (turbo-decoded) by the repetition decoder 237. The controller 238 controls the operation and decoding conditions of the repetition decoder 237.

The method for decoding the turbo code is the MAP (maximum a posteriori probability) decoding method, and so on. However, because the MAP decoding method requires relatively large computational complexity, the decoder for decoding the turbo code that uses the MAP decoding method requires a complex and large scale circuit. Therefore, it is not easy to raise the operational speed of such a decoder for decoding the turbo code.

FIG. 4 shows a decoding method for decoding the turbo code in a case wherein the repetition decoder 237 as shown in FIG. 2 consists of a single turbo decoder. Each of data blocks 401 and 402 is respectively one interleave unit that is interleaved by the interleaver 213 as shown in FIG. 2, that is to say, the data block is one unit to be turbo-encoded by the turbo-encoding process. The horizontal axis shown in FIG. 4 shows an elapsed time.

In FIG. 4, the start of the data block 401 is supplied to the memory 236 as shown in FIG. 2 at time t1 and the whole data block 401 is stored in the memory 236 at time t2. The repetition decoder 237 as shown in FIG. 2 starts decoding the data block 401 from time t2. Next, the start of the data block 402 is supplied to the memory 236 at time t2 and the whole data block 402 is stored in the memory 236 at time t3. However, the repetition decoder 237 as shown in FIG. 2 cannot start decoding the data block 402 at time t3 because the repetition decoder 237 is presently decoding the data block 401.

At time t4, the repetition decoder 237 finishes decoding the data block 401 and it starts outputting the decoded data of the data block 401. At the same time, the repetition decoder 237 starts decoding the data block 402 from time t4 and finishes decoding the data block 402 at time t5. Then, the repetition decoder 237 starts outputting the decoded data of the data block 402 at time t5.

As described above, if the repetition decoder 237 shown in FIG. 2 is constructed by one turbo decoder, it is not possible to immediately start decoding the data blocks that continuously arrive at the memory 236 at the time they arrive at the memory 236. Therefore, it is required to wait to start decoding the next data block until the decoding of the present data block is fully completed, so the succeeding data blocks have to be kept in the memory 236. As a result, the processing time is prolonged and it is not possible to continuously output data from the repetition decoder 237.

On the other hand, to solve the problem mentioned above, if a plurality of the same turbo decoders are provided in the repetition decoder 237, it is possible to decode the plurality of the data blocks in parallel. Therefore, it is possible to reduce the processing time and to start processing the data blocks that continuously arrive at the memory 236 at the time they arrive at the memory 236. However, if the plurality of the turbo decoders are provided in the repetition decoder, the circuit scale and the cost of the decoder are increased.

SUMMARY OF THE INVENTION

It is a general object of the present invention to provide an information recording and reproduction apparatus, an optical disk apparatus and a data reproduction method in which the above disadvantages are eliminated.

A more specific object of the present invention is to provide an information recording and reproduction apparatus, an optical disk apparatus and a data reproduction method in which the turbo-decoding for each of the data blocks can be performed in parallel to reduce the processing time of the turbo-decoding, and the increase of the circuit scale of the decoder can be prevented.

The above objects of the present invention are achieved by providing a plurality of turbo decoders to perform a plurality of decoding processes in parallel and to reduce the processing time, and by sharing the circuit by the plurality of turbo decoders to prevent the increase of the circuit scale.

The above objects of the present invention are achieved by an information recording and reproduction apparatus having a turbo decoder that decodes turbo encoded data. The turbo decoder has a plurality of likelihood ratio calculation units, forward direction path probability calculation units, the number of which is less than the number of the plurality of likelihood ratio calculation units, and backward direction path probability calculation units, the number of which is less than the number of the plurality of likelihood ratio calculation units. The plurality of likelihood ratio calculation units calculates in parallel the likelihood ratio for each of a plurality of data blocks. The forward direction path probability calculation units time-divisionally calculate probabilities of the forward direction paths for the plurality of data blocks. The backward direction path probability calculation units time-divisionally calculate probabilities of the backward direction paths for the plurality of data blocks.

According to the present invention, it is possible to provide the information recording and reproduction apparatus in which a plurality of turbo decoder are provided to perform a plurality of decoding processes in parallel and to reduce processing time, and the circuit is shared by the decoders to prevent an increase of the circuit scale.

The above objects of the present invention are achieved by an information recording and reproduction apparatus having a turbo decoder that decodes turbo encoded data. The turbo decoder has a plurality of likelihood ratio calculation units, forward direction path probability calculation units, the number of which is less than the number of the plurality of likelihood ratio calculation units, backward direction path probability calculation units, the number of which is less than the number of the plurality of likelihood ratio calculation units, forward direction path probability memory units that store calculation results calculated by the forward direction path probability calculation units and backward direction path probability memory units that store calculation results calculated by the backward direction path probability calculation units. The plurality of likelihood ratio calculation units calculate in parallel the likelihood ratio for each of a plurality of data blocks. The forward direction path probability calculation units time-divisionally calculate probabilities of the forward direction paths for the plurality of data blocks. The backward direction path probability calculation units time-divisionally calculate probabilities of the backward direction paths for the plurality of data blocks. Forward direction path probability memory units time-divisionally store the probabilities of the forward direction paths for each of the plurality of data blocks time-divisionally calculated by the forward direction path probability calculation units. Backward direction path probability memory units time-divisionally store the probabilities of the backward direction paths for the plurality of data blocks time-divisionally calculated by each of the backward direction path probability calculation units.

According to the present invention, it is possible to provide an information recording and reproduction apparatus in which a plurality of turbo decoder are provided to perform a plurality of decoding processes in parallel and to reduce processing time, and the circuit is shared by the decoders to prevent an increase of the circuit scale.

BRIEF DESCRIPTION OF THE DRAWINGS

Other objects, features and advantages of the present invention will become more apparent from the following detailed description when read in conjunction with the accompanying drawings, in which:

FIG. 11 shows a flow chart of a repetition process according to the other embodiment of the present invention.

DESCRIPTION OF THE PREFERRED EMBODIMENTS

The embodiments of the present invention will be explained with reference to FIG. 5 through FIG. 11.

First, a principle of the present invention will be explained with reference to FIG. 5.

Figure 5:
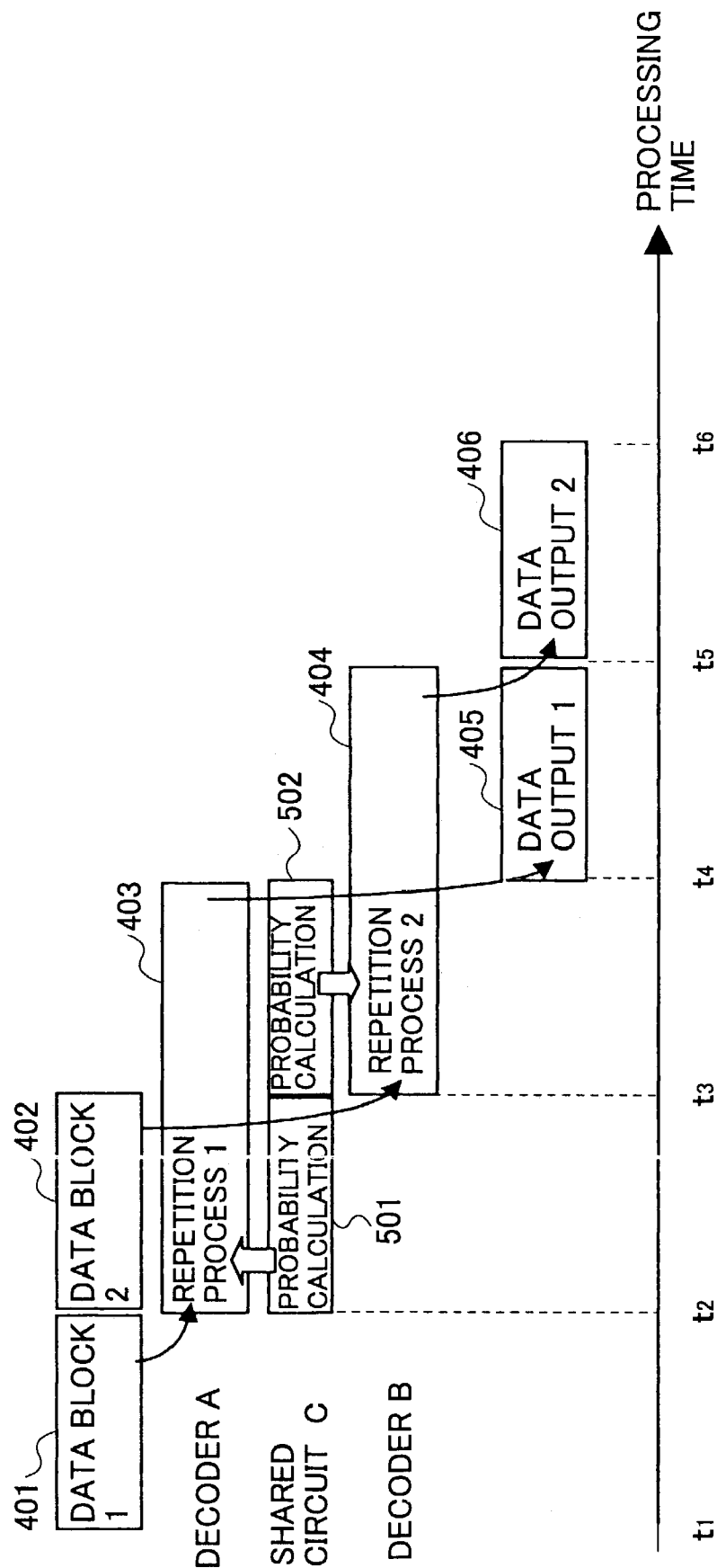
FIG. 5 shows a principle of the repetition decoding method for the turbo code.

FIG. 5 shows a principle of the repetition decoding method for the turbo code according to the present invention. According to the present invention, the turbo decoding circuit consists of two parts, in one part of which probability of a forward direction path and probability of a backward direction path are calculated, and in another part of which a branch metric and a logarithm likelihood ratio are calculated. According to the present invention, the part in which the branch metric and the logarithm likelihood ratio are calculated has the circuits, the number of which is equal to the number of processes that are performed in parallel, and the part in which the probability of the forward direction path and the probability of the backward direction path are calculated has the circuits, the number of which is less than the number of processes that are performed in parallel by means of sharing the circuits.

FIG. 5 also shows a time sequence of the turbo decoding process according to the present invention, in which two data blocks are simultaneously processed. The decoder circuits A and B calculate the branch metric and the logarithm likelihood ratio and the shared circuit C time-divisionally calculates both the probability of the forward direction path and the probability of the backward direction path.

Figure 1:
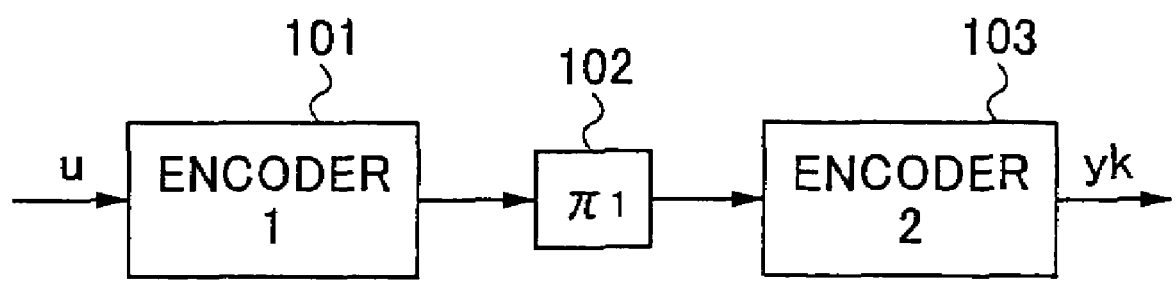
FIG. 1 shows a block diagram of an example of a turbo encoder according to the prior art.
Figure 2:
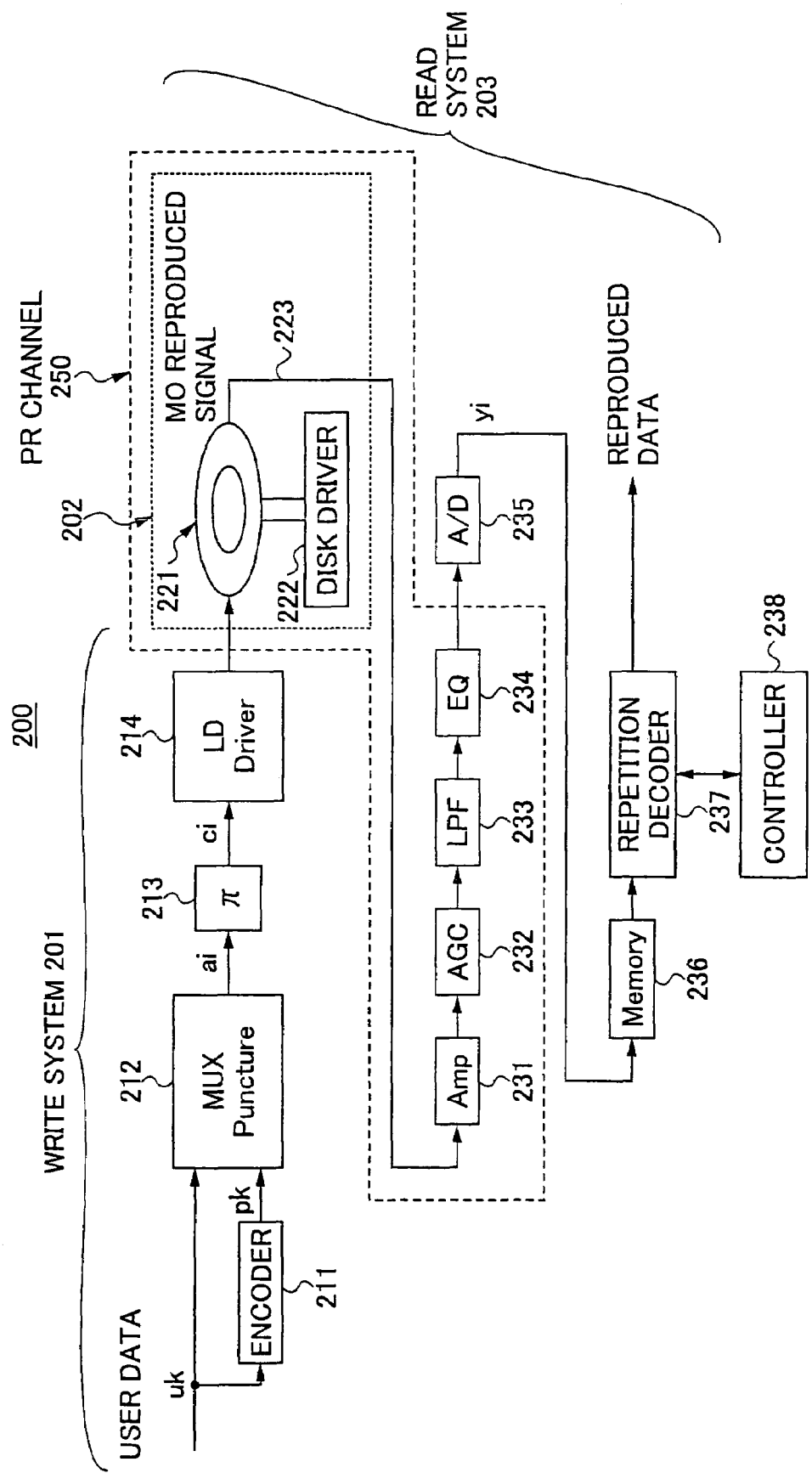
FIG. 2 shows a block diagram of an example of an information recording and reproduction apparatus 200 according to the prior art.
Figure 3:
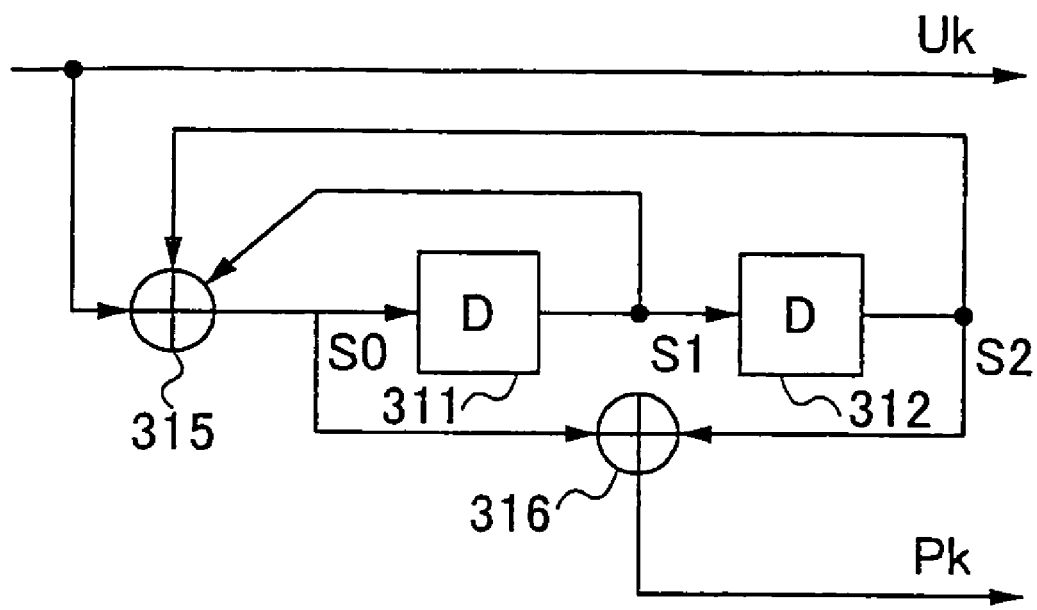
FIG. 3 shows a block diagram of an example of an encoder of the write system according to the prior art.
Figure 4:
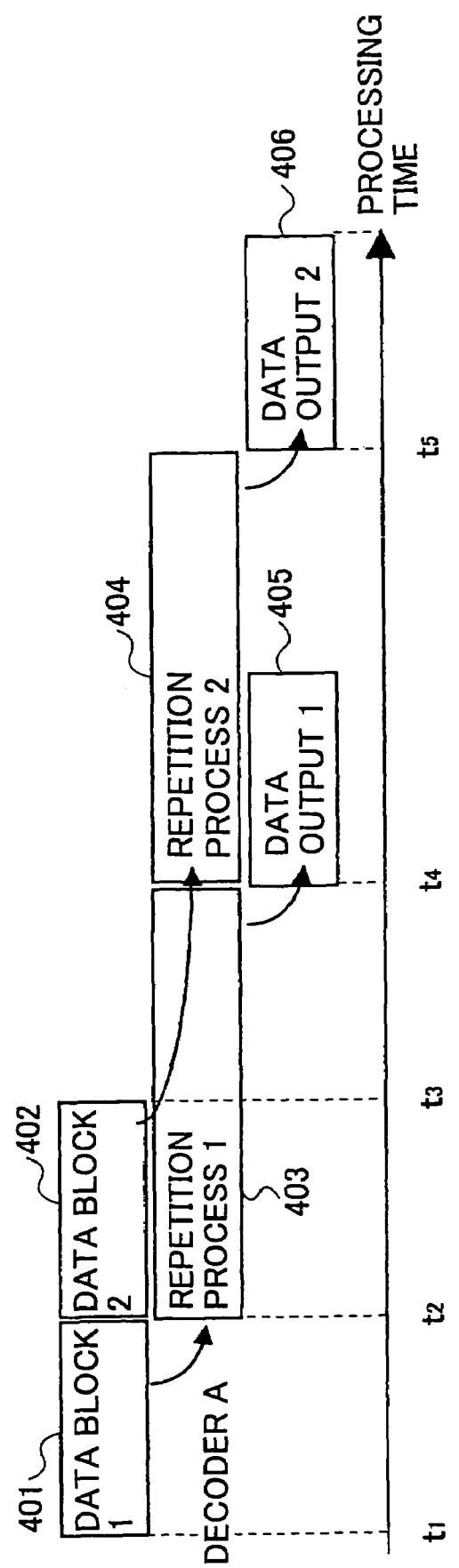
FIG. 4 shows a decoding method for decoding the turbo code in a case wherein the repetition decoder consists of a single turbo decoder according to the prior art.

In FIG. 5, the start of the data block 401 is input to the memory 236 as shown in FIG. 2 at time t1 and the whole data of the data block 401 is stored in the memory 236 at time t2. The decoder A in the repetition decoder 237 starts decoding the data block 401 from time t2. To decode the data block 401, the probability of the forward direction path and the probability of the backward direction path are calculated in the shared circuit C and the decoder circuit A repeatedly decodes the data block 401 using the probability of the forward direction path and the probability of the backward direction path calculated by the shared circuit C. When the repetition decoding process for the data block 401 is finished at time t4, the decoded data of the data block 401 is output from time t4.

On the other hand, the start of the data block 402 is input to the memory 236 as shown in FIG. 2 at time t2 and the whole data of the data block 402 is stored in the memory 236 at time t3. At time t3, because the shared circuit C has finished calculation of the probability of the forward direction path and the probability of the backward direction path for the data block 401, the shared circuit C can calculate the probability of the forward direction path and the probability of the backward direction path for the data block 402 as described above. The decoder circuit B repeatedly decodes the data block 402 using the probability of the forward direction path and the probability of the backward direction path calculated by the circuit C and then, the repetition decoding process is finished at time t5. Then, the decoded data of the data block 402 is output from time t5.

As described above, the decoding process for the data block 401 and the decoding process for the data block 402 are performed in parallel between time t3 and time t4. Therefore, the time needed for the decoding process is reduced. Furthermore, increase of the circuit scale of the decoder circuit can be prevented because the probability of the forward direction path and the probability of the backward direction path for the data block 401 and those for the data block 402 are alternately calculated by the shared circuit C in the decoder.

Next, one embodiment of the present invention will be explained with reference to FIG. 6 through FIG. 9.

First, a method for turbo-decoding using a single turbo decoder will be explained with reference to FIG. 6 and FIG. 7.

Figure 6:
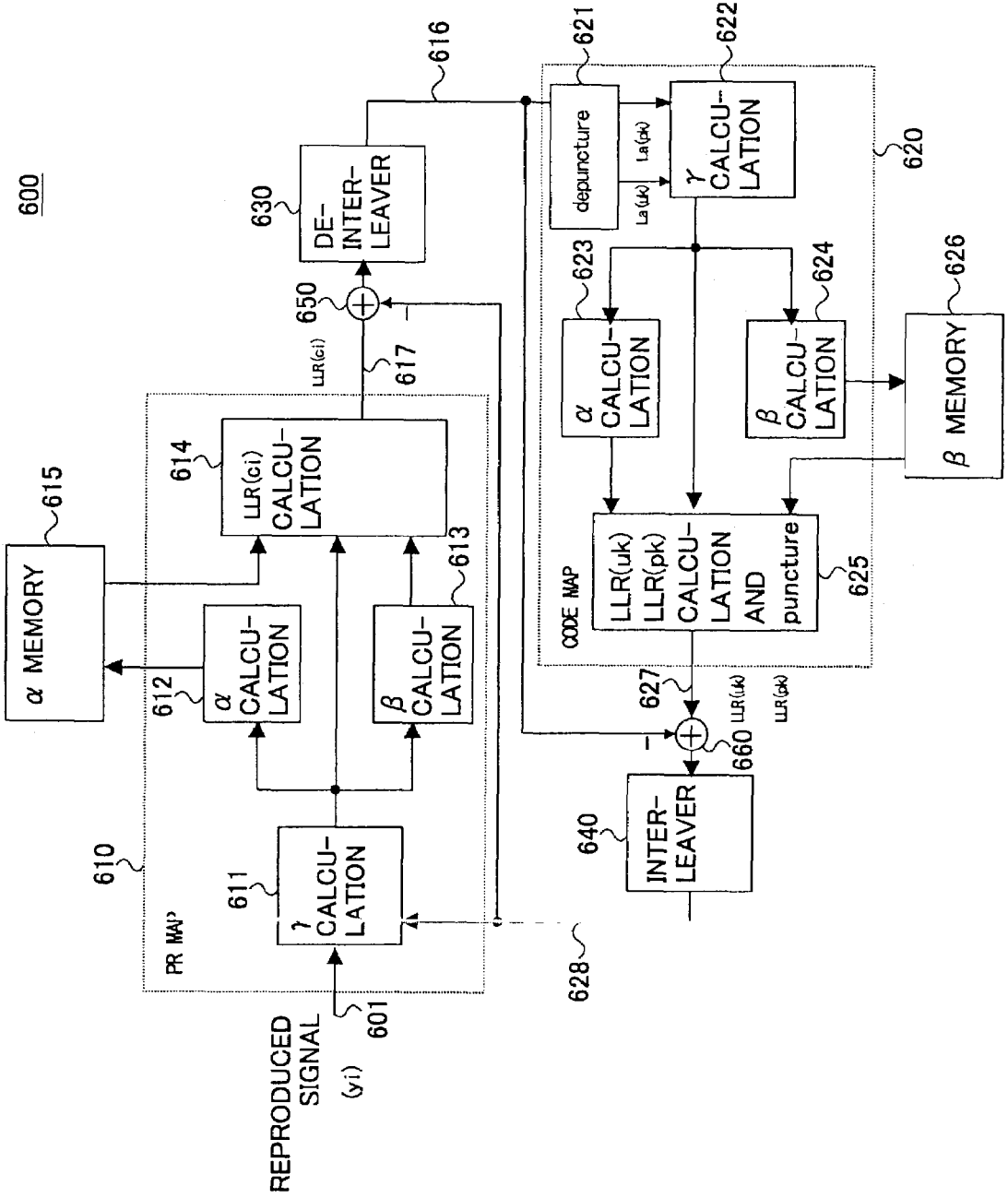
FIG. 6 shows an block diagram of a turbo decoder for decoding the turbo code using a single turbo decoder.

FIG. 6 shows a decoder 600 of an embodiment of the repetition decoder 237 as shown in FIG. 2. Especially, FIG. 6 shows an block diagram of a turbo decoder for decoding the turbo code using a single turbo decoder. The decoder 600 as shown in FIG. 6 mainly has a PR-MAP (partial response-maximum a posteriori probability) decoder 610 that decodes a reproduced signal practically encoded through the PR channel, a CODE-MAP decoder 620 that decodes a signal encoded by the encoder 211 as shown in FIG. 2, a deinterleaver 630 that reorders the order of the data interleaved by the interleaver 213 as shown in FIG. 2 to an original order of the data and an interleaver 640 that changes the order of the data the same as the interleaver 213 does.

The PR-MAP decoder 610 mainly has a γ calculation block 611 that calculates a branch metric, an α calculation block 612 that calculates a probability of the forward direction path, a β calculation block 613 that calculates a probability of the backward direction path and an LLR(ci) calculation block 614 that calculates a logarithm likelihood ratio. Furthermore, an α memory 615 that temporarily stores results calculated by the α calculation block 612 is arranged between the α calculation block 612 and the LLR(ci) calculation block 614. A subtracter 650 subtracts a prior probability value 628 that is an output of the interleaver 640 from a logarithm likelihood ratio LLR(ci) 617 that is the output of the PR-MAP decoder 610, and then the logarithm likelihood ratio LLR(ci) 617 is supplied to the depuncture block 621 in the CODE-MAP decoder 620 through the deinterleaver 630 as a prior probability value 616.

The CODE-MAP decoder 620 mainly has the depuncture block 621 that inserts bits meaning the probability of zero into the depunctured bits in the input signal of the depuncture block 621, which are depunctured by the MUX and puncture block 212, a γ calculation block 622 that calculates a branch metric, an α calculation block 623 that calculates a probability of the forward direction path, a β calculation block 624 that calculates a probability of the backward direction path and an LLR(uk), LLR(pk) calculation and puncture block 625 that calculates a logarithm likelihood ratio. Furthermore, a β memory 626 that temporarily stores results calculated by the β calculation block 624 is arranged between the β calculation block 624 and the LLR(uk), LLR(pk) calculation and puncture block 625. A subtracter 660 subtracts a prior probability value 616 to the CODE-MAP decoder 620 from a logarithm likelihood ratio LLR(ai) 627 that is the output of the CODE-MAP decoder 620, and then the logarithm likelihood ratio LLR(ai) 627 is supplied to the γ calculation block 611 in the PR-MAP decoder 610 through the interleaver 640 as a prior probability value 628.

Figure 7:
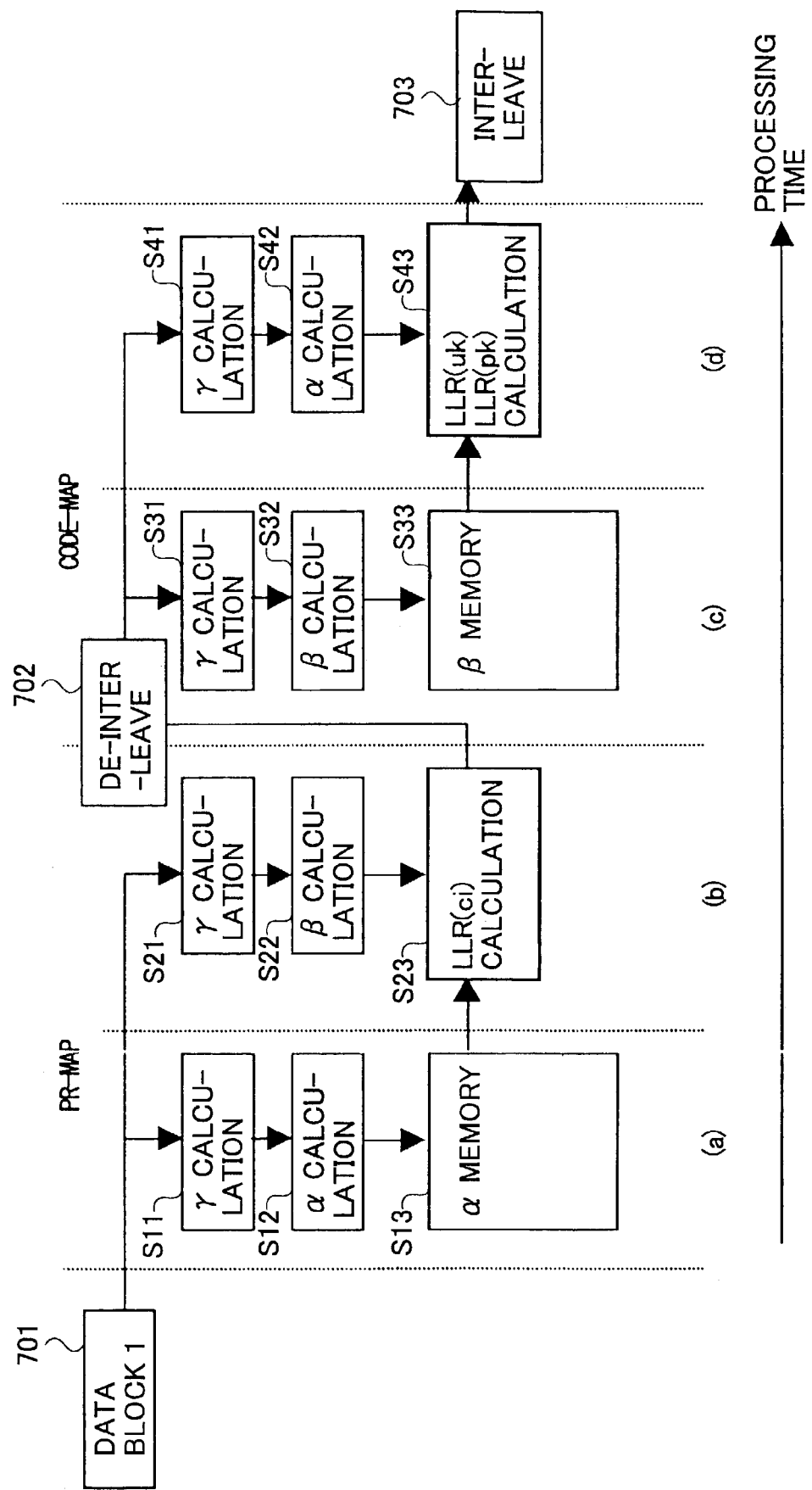
FIG. 7 shows a flow chart of one process cycle of the repetition processes.

FIG. 7 shows a flow chart of one process cycle of the repetition processes. Therefore, it is needed to perform twice the operations shown in FIG. 7 when the two-times repetition decoding is performed.

In FIG. 7, it is shown how each of the calculation blocks provided in the PR-MAP decoder 610 and the CODE-MAP decoder 620 is used along the elapsed time line.

First, when the data block 1 is supplied to the memory 236 in the read system 203 as shown in FIG. 2, the decoding of the data block 1 is started.

During time interval (a) as shown in FIG. 7, at step S11, the γ calculation block 611 in the PR-MAP decoder 610 calculates the branch metric. Next, at step S12, the α calculation block 612 calculates the probability of the forward direction path and at the same time at step S13, the result of the probability of the forward direction path is stored in the α memory 615. Thus, the result of the probability of the forward direction path is stored in the α memory 615 while the data block 1 is being stored in the memory 236 as shown in FIG. 2.

During time interval (b) as shown in FIG. 7, at step S21, the γ calculation block 611 in the PR-MAP decoder 610 calculates the branch metric. Next, at step S22, the β calculation block 613 calculates the probability of the backward direction path and at the same time at step S23, the logarithm likelihood ratio is calculated by the LLR(ci) calculation block 614 while the results of the calculation of the probability of the forward direction path are being read from the α memory 615, which are calculated and stored to the α memory 615 during time interval (a). Then, the subtracter 650 subtracts the prior probability 628 from the calculated logarithm likelihood ratio and next, a data block 702 that is deinterleaved by the deinterlever 630 as shown in FIG. 6 is generated.

It is possible to start the calculation of the probability of the forward direction path earlier because the calculation of the probability of the forward direction path by the α calculation block 612 is performed before the calculation of the probability of the backward direction path by the β calculation block 613 is performed.

Next, during time interval (c), at step S31, the bits are inserted to the deinterleaved data block 702 by the depuncture block 621 in the CODE-MAP decoder 620 and then, and the γ calculation block 622 in the CODE-MAP decoder 620 calculates the branch metric using the deinterleaved and bit-inserted data. Next, at step S32, the β calculation block 624 calculates the probability of the backward direction path and at the same time at step S33, the result of the probability of the backward direction path is stored in the β memory 626.

During time interval (d) as shown in FIG. 7, at step S41, the γ calculation block 622 in the CODE-MAP decoder 620 calculates the branch metric using the deinterleaved and bit-inserted data supplied from the depuncture block 621 in the CODE-MAP decoder 620. Next, at step S42, the α calculation block 623 calculates the probability of the forward direction path and at the same time at step S43, the logarithm likelihood ratio is calculated by the LLR(uk), LLR(pk) calculation and puncture block 625 while the results of the calculation of the probability of the backward direction path are being read from the β memory 626. Then, the bits are eliminated from the calculated result in the same way as the MUX and puncture block 212 does. Then, the subtracter 660 subtracts the prior probability 616 from the calculated logarithm likelihood ratio 627 and next, a data block 703 that is interleaved by the interleaver 640 as shown in FIG. 6 is generated.

In the CODE-MAP decoder 620, the probability of the forward direction path and the probability of the backward direction path are calculated in the same way as the PR MAP decoder 610 does. However, the probability of the backward direction path is calculated before the probability of the forward direction path is calculated in consideration of the order of the reproduced data.

As described above with reference to FIG. 7, the flow chart of one process cycle of the repetition processes is described. If the repetition number is equal to or greater than two times, the PR-MAP decoder 610 performs the decoding as described above.

Then, the decoding by the PR-MAP decoder 610 and the CODE-MAP decoder 620 are repeated and finally, each sign of the output signal values LLR(uk) supplied from the LLR(uk), LLR(pk) calculation and puncture block 625 is the same as the reproduced data decoded by the repetition decoder 237 as shown in FIG. 2.

Next, one embodiment of the present invention in which the turbo decoding processes are simultaneously performed by a plurality of decoders will be explained with reference to FIG. 8 and FIG. 9.

Figure 8:
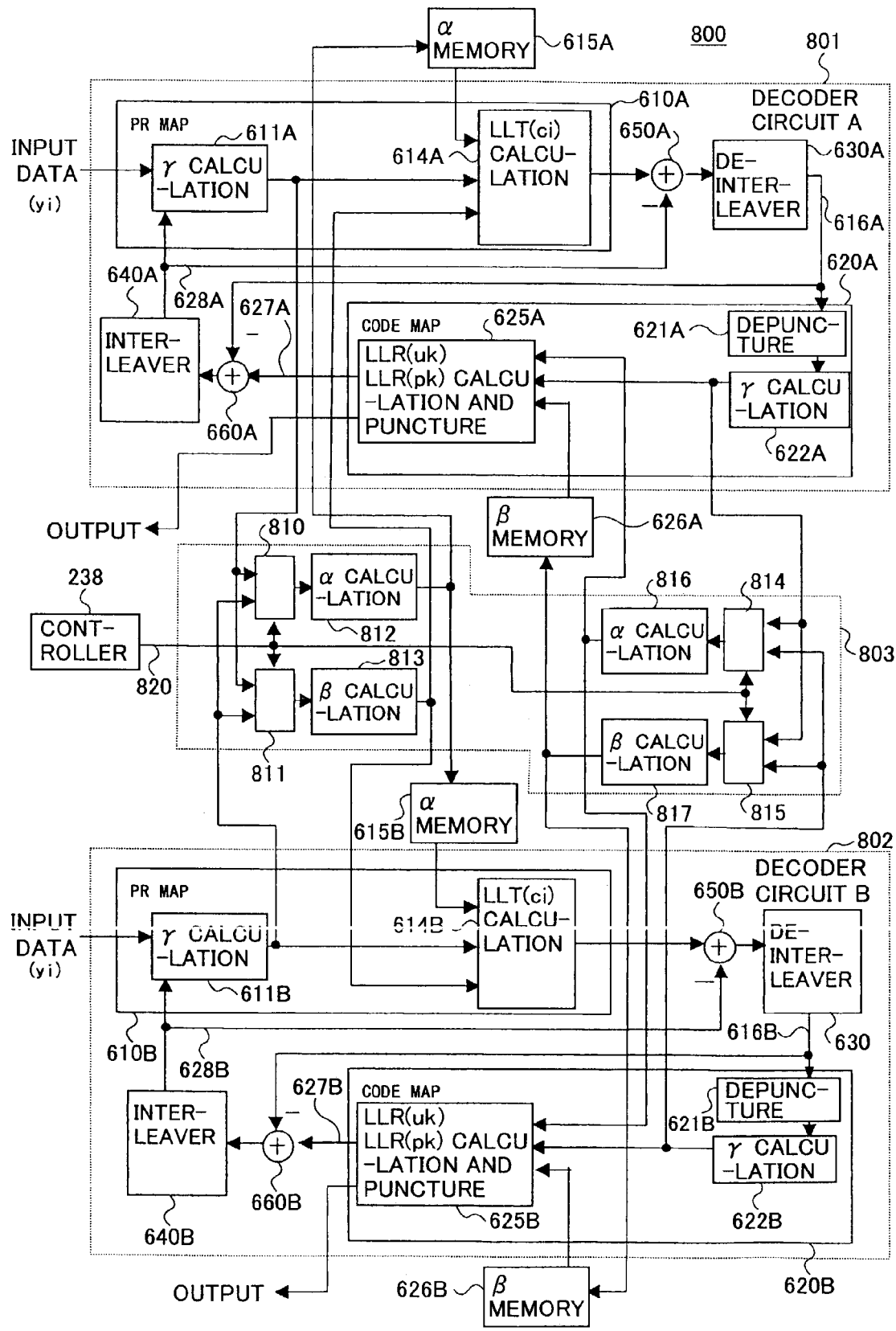
FIG. 8 shows a block diagram of a turbo decoder according to one embodiment of the present invention.

FIG. 8 shows a block diagram of a decoder 800 that is an embodiment of the repetition decoder 237 according to the present invention. Especially, FIG. 8 shows the decoder 800 that decodes the turbo code using two decoders 801 and 802. The components as shown in FIG. 8 correspond to the components having the same reference numbers as shown in FIG. 6. For example, the γ calculation block 611A and the γcalculation block 611B as shown in FIG. 8 are the same components as the γ calculation block 611 shown in FIG. 6.

In FIG. 8, a decoder circuit A 801 is equal to the circuit in which the α calculation block 612, the β calculation block 613, the α calculation block 623 and the β calculation block 624 are removed from the decoder circuit 600 as shown in FIG. 6. A decoder circuit B 802 is also equal to the circuit in which the α calculation block 612, the β calculation block 613, the α calculation block 623 and the β calculation block 624 are removed from the decoder circuit 600 as shown in FIG. 6. The circuit 803 mainly has switching blocks 810 and 811, the α calculation block 812, the β calculation block 813, switching blocks 814 and 815, the α calculation block 816 and the β calculation block 817. Each of the switching blocks 810, 811, 814 and 815 has two input terminals and one output terminal, and it is controlled as to which one of the signals input to the two input terminals is supplied to the output terminal according to a control signal 820 supplied from the controller 238 as shown in FIG. 2.

Figure 9:
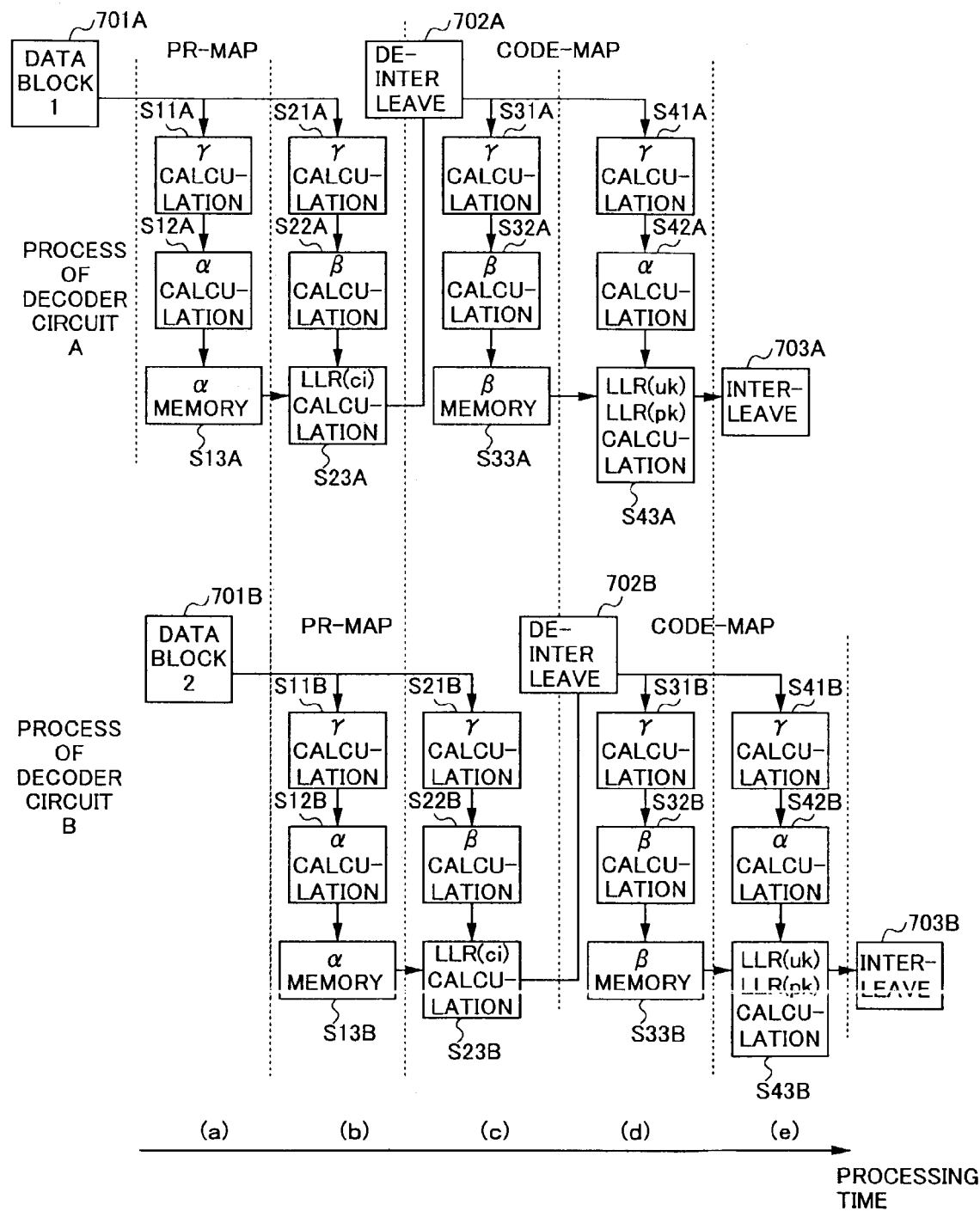
FIG. 9 shows a flow chart of one process cycle of a repetition process according to one embodiment of the present invention.

FIG. 9 shows a flow chart of one process cycle of the repetition processes for decoding the turbo code, which is performed in the decoder 800 having the decoder circuit A 801 and the decoder circuit B 802 as shown in FIG. 8. Therefore, the operations shown in FIG. 9 by the decoder circuit A 801 and the decoder circuit B 802 need to be performed twice when the two-times repetition decoding is performed.

The steps in FIG. 9 correspond to the same steps having the same reference numbers as shown in FIG. 7. For example, each of steps S11A and S11B as shown in FIG. 9 is a step in which the same operation is performed as in the step S11 as shown in FIG. 7.

First, when the data block 1 is supplied to the memory 236 as shown in FIG. 2, the decoding of the data block 1 is started.

During time interval (a) as shown in FIG. 9, the switching block 810 is controlled by the output 820 of the controller 238 to select the input signal supplied from the γ calculation block 611A as the output signal. In the decoder circuit A 801, at step S12A, the γ calculation block 611A in the PR-MAP decoder 610A calculates the branch metric using the data block 1 stored in the memory 236. Next, at step S12A, the α calculation block 812 in the circuit 803 calculates the probability of the forward direction path and at the same time at step S13A, the result of the probability of the forward direction path is stored in the α memory 615A. Thus, the result of the probability of the forward direction path is stored in the α memory 615A while the data block 1 is being stored in the memory 236 as shown in FIG. 2.

During time interval (b) as shown in FIG. 9, the switching block 810 is controlled by the output 820 of the controller 238 to select the input signal supplied from the γ calculation block 611B as the output signal and the switching block 811 is controlled to select the input signal supplied from the γ calculation block 611A as the output signal.

In the decoder circuit A 801, at step S21A, the γ calculation block 611A in the PR-MAP decoder 610A calculates the branch metric using the data block 1 stored in the memory 236 as shown in FIG. 2. Next, at step S22A, the β calculation block 813 calculates the probability of the backward direction path and at the same time at step S23A, the logarithm likelihood ratio is calculated by the LLR(ci) calculation block 614A while the results of the calculation of the probability of the forward direction path are being read from the α memory 615A, which are calculated and stored to the α memory 615A during time interval (a). Then, the subtracter 650A subtracts the prior probability 628A from the calculated logarithm likelihood ratio and next, a data block 702A that is deinterleaved by the deinterlever 630A as shown in FIG. 8 is generated.

In the decoder circuit B 802, at step S11B, the γ calculation block 611B in the PR-MAP decoder 610B calculates the branch metric using the data block 2 stored in the memory 236 as shown in FIG. 2. Next, at step S12B, the α calculation block 812 in the circuit 803 calculates the probability of the forward direction path and at the same time at step S13B, the result of the probability of the forward direction path is stored in the α memory 615B. Thus, the result of the probability of the forward direction path is stored in the α memory 615B while the data block 2 is being stored in the memory 236 as shown in FIG. 2.

During time interval (c) as shown in FIG. 9, the switching block 811 is controlled by the output 820 of the controller 238 to select the input signal supplied from the γ calculation block 611B as the output signal. On the other hand, the switching block 815 is controlled by the output 820 of the controller 238 to select the input signal supplied from the γ calculation block 622A as the output signal.

In the decoder circuit A 801, at step S31A, the bits are inserted to the deinterleaved data block 702A by the MUX and puncture block 621A in the CODE-MAP decoder 620A and then, the γ calculation block 622A in the CODE-MAP decoder 620A calculates the branch metric using the deinterleaved and bit-inserted data. Next, at step S32A, the β calculation block 817 calculates the probability of the backward direction path and at the same time at step S33A, the result of the probability of the backward direction path is stored in the β memory 626A.

In the decoder circuit B 802, at step S21B, the γ calculation block 611B in the PR-MAP decoder 610B calculates the branch metric using the data block 2 stored in the memory 236 as shown in FIG. 2. Next, at step S22B, the β calculation block 813 calculates the probability of the backward direction path and at the same time at step S23B, the logarithm likelihood ratio is calculated by the LLR(ci) calculation block 614B while the results of the calculation of the probability of the forward direction path are being read from the α memory 615B, which are calculated and stored to the α memory 615B during time interval (b). Then, the subtracter 650B subtracts the prior probability 628B from the calculated logarithm likelihood ratio and next, a data block 702B that is deinterleaved by the deinterlever 630B as shown in FIG. 8 is generated.

Next, during time interval (d) as shown in FIG. 9, the switching block 814 is controlled by the output 820 of the controller 238 to select the input signal supplied from the γ calculation block 622A as the output signal and the switching block 815 is controlled to select the input signal supplied from the γ calculation block 622B as the output signal.

In the decoder circuit A 801, at step S41A, the γ calculation block 622A in the CODE-MAP decoder 620A calculates the branch metric using the deinterleaved and bit-inserted data supplied from the depuncture block 621A in the CODE-MAP decoder 620A. Next, at step S42A, the α calculation block 816 calculates the probability of the forward direction path and at the same time at step S43A, the logarithm likelihood ratio is calculated by the LLR(uk), LLR(uk) calculation and puncture block 625A while the results of the calculation of the probability of the backward direction path are being read from the β memory 626A. Then, the bits are eliminated from the calculated result in the same way as the MUX and puncture block 212 does. Then, the subtracter 660A subtracts the prior probability 616A from the calculated logarithm likelihood ratio 627A and next, a data block 703A that is interleaved by the interleaver 640A as shown in FIG. 8 is generated.

In the decoder circuit B 802, at step S31B, the bits are inserted to the deinterleaved data block 702B by the MUX and puncture block 621B in the CODE-MAP decoder 620B and then, the γ calculation block 622B in the CODE-MAP decoder 620B calculates the branch metric using the deinterleaved and bit-inserted data. Next, at step S32B, the β calculation block 817 calculates the probability of the backward direction path and at the same time at step S33B, the result of the probability of the backward direction path is stored in the β memory 626B.

Next, during time interval (e) as shown in FIG. 9, the switching block 814 is controlled by the output 820 of the controller 238 to select the input signal supplied from the γ calculation block 622B as the output signal.

In the decoder circuit B 802, at step S41B, the γ calculation block 622B in the CODE-MAP decoder 620B calculates the branch metric using the deinterleaved and bit-inserted data supplied from the depuncture block 621B in the CODE-MAP decoder 620B. Next, at step S42B, the α calculation block 816 calculates the probability of the forward direction path and at the same time at step S43B, the logarithm likelihood ratio is calculated by the LLR(uk), LLR(uk) calculation and puncture block 625B while the results of the calculation of the probability of the backward direction path are being read from the β memory 626B. Then, the bits are eliminated from the calculated result in the same way as the MUX and puncture block 212 does. Then, the subtracter 660B subtracts the prior probability 616B from the calculated logarithm likelihood ratio 627B and next, a data block 703B that is interleaved by the interleaver 640B as shown in FIG. 8 is generated.

As described above, because the decoder circuit A 801, the decoder circuit B 802 and the circuit 803 that calculates the probability of the forward direction path and the probability of the backward direction path are provided, and the circuit 803 can be time-divisionally used by the decoder circuit A 801 and the decoder circuit B 802, the two turbo decoders can simultaneously decode the turbo codes. Furthermore, the circuit scale of the repetition decoder 237 can be reduced by sharing the circuit 803 that calculates the probability of the forward direction path and the probability of the backward direction path compared to the case where the dual decoder circuits 600 as shown in FIG. 6 are provided.

Next, another embodiment according to the present invention will be explained with reference to FIG. 10 and FIG. 11.

Figure 10:
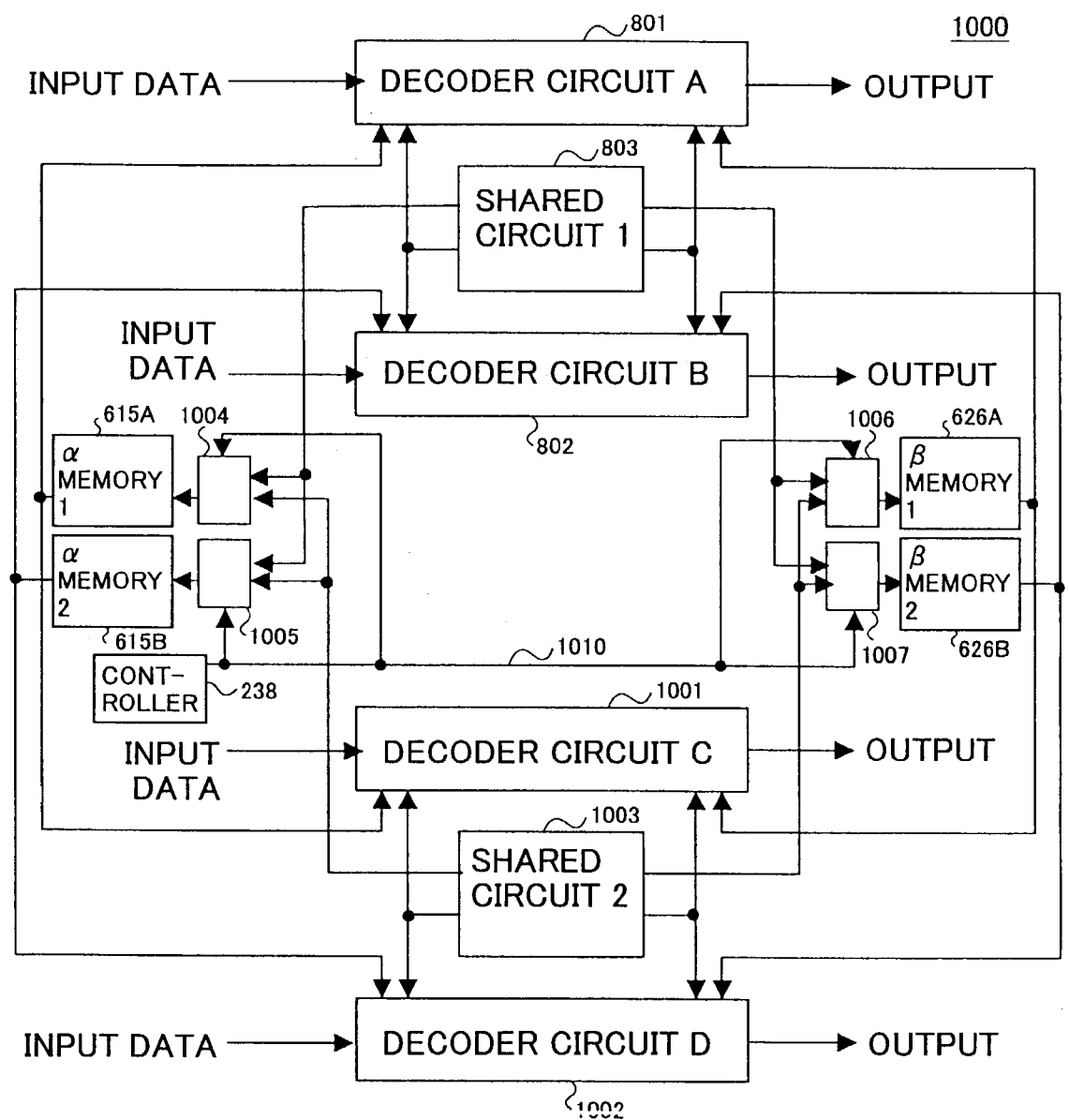
FIG. 10 shows a block diagram of a turbo decoder according to another embodiment of the present invention.

FIG. 10 shows a block diagram of a decoder 1000 that is an embodiment of the repetition decoder 237 according to the present invention. Especially, FIG. 10 shows the decoder 1000 that decodes the turbo codes in parallel using a decoder C 1001 and a decoder D 1002 as well as the decoder A 801 and the decoder B 802. In FIG. 10, the decoder 1000 mainly has the four decoders 801, 801, 1001 and 1002, the shared circuits 803 and 1003, the switching blocks 1004, 1005, 1006 and 1007, the α memory 615A, the α memory 615B, the β memory 626A and the β memory 626B.

The components as shown in FIG. 10 correspond to the components having the same reference numbers as shown in FIG. 8. Further, the newly added decoder circuit C 1001 is identical to the decoder circuit A 801, the newly added decoder circuit D 1002 is identical to the decoder circuit B 802, and the shared circuit 1003 is identical to the shared circuit 803. Each of the switching blocks 1004, 1005, 1006 and 1007 has two input terminals and one output terminal and is controlled by the control signal 1010 supplied from the controller 238 to select one of the input signals as the output signal.

In this embodiment, the decoding operations are performed in parallel by the decoder circuits A, B, C and D. Furthermore, the circuit scale of the decoder 1000 is reduced because the α memory 615A and the β memory 626A are shared by the decoder circuits A and C, and the α memory 615B and the β memory 626B are shared by the decoder circuits B and D.

FIG. 11 shows the time intervals during which the α memory 615A, the β memory 626A, the α memory 615B and the β memory 626B are respectively used.

During time interval (a) as shown in FIG. 11, the switching block 1004 is controlled by the output 1010 of the controller 238 to select the input signal supplied from the shared circuits 803 as the output signal. Therefore, the α memory 615A is used by the decoder circuit A.

During time interval (b) as shown in FIG. 11, the switching block 1004 is controlled by the output 1010 of the controller 238 to select the input signal supplied from the shared circuits 803 as the output signal and the switching block 1005 is controlled to select the input signal supplied from the shared circuits 803 as the output signal. Therefore, the α memory 615A is used by the decoder circuit A and the α memory 615B is used by the decoder circuit B.

During time interval (c) as shown in FIG. 11, the switching block 1006 is controlled by the output 1010 of the controller 238 to select the input signal supplied from the shared circuits 803 as the output signal and the switching block 1005 is controlled to select the input signal supplied from the shared circuits 803 as the output signal and the switching block 1004 is controlled to select the input signal supplied from the shared circuits 1003 as the output signal. Therefore, the β memory 626A is used by the decoder circuit A and the β memory 615B is used by the decoder circuit B and the α memory 615A is used by the decoder circuit C.

During time interval (d) as shown in FIG. 11, the switching block 1006 is controlled by the output 1010 of the controller 238 to select the input signal supplied from the shared circuits 803 as the output signal and the switching block 1007 is controlled to select the input signal supplied from the shared circuits 803 as the output signal and the switching block 1004 is controlled to select the input signal supplied from the shared circuits 1003 as the output signal and the switching block 1005 is controlled to select the input signal supplied from the shared circuits 1003 as the output signal. Therefore, the β memory 626A is used by the decoder circuit A and the β memory 626B is used by the decoder circuit B and the α memory 615A is used by the decoder circuit C and the α memory 615B is used by the decoder circuit D.

During time interval (e) as shown in FIG. 11, the switching block 1007 is controlled by the output 1010 of the controller 238 to select the input signal supplied from the shared circuits 803 as the output signal and the switching block 1006 is controlled to select the input signal supplied from the shared circuits 1003 as the output signal and the switching block 1005 is controlled to select the input signal supplied from the shared circuits 1003 as the output signal. Therefore, the β memory 626B is used by the decoder circuit B and the β memory 626A is used by the decoder circuit C and the α memory 615B is used by the decoder circuit D. Furthermore, the α memory 615A is used by the decoder circuit A in the same way as used during time interval (a).

During time interval (f) as shown in FIG. 11, the switching block 1006 is controlled by the output 1010 of the controller 238 to select the input signal supplied from the shared circuits 1003 as the output signal and the switching block 1007 is controlled to select the input signal supplied from the shared circuits 1003 as the output signal. Therefore, the β memory 626A is used by the decoder circuit C and the β memory 626B is used by the decoder circuit D. Furthermore, the decoder circuits A and B use the same memories as used during time interval (b).

During time interval (g) as shown in FIG. 11, the switching block 1007 is controlled by the output 1010 of the controller 238 to select the input signal supplied from the shared circuits 1003 as the output signal. Therefore, the β memory 626B is used by the decoder circuit D. Furthermore, the decoder circuits A, B and C use the same memories as used during time interval (c).

As described above, the α memory 615A, the β memory 626A, the α memory 615B and the β memory 626B can be time-divisionally shared by the decoder circuits A, B, C and D so as not to be used at the same time by the different decoders. Therefore, the number of memories to be used for decoding can be reduced by means of sharing the memories by the decoder circuits compared to providing twice the memories and the decoder circuits as the same numbers shown in FIG. 8.

The present invention is not limited to the specifically disclosed embodiments, and variations and modifications may be made without departing from the scope of the present invention.

The present application is based on Japanese priority application No.2002-166899 filed on Jun. 7, 2002, the entire contents of which are hereby incorporated by reference.

What is claimed is:

1. An information recording and reproduction apparatus having a turbo decoder that decodes turbo encoded data, wherein
said turbo decoder has a plurality of likelihood ratio calculation units, a plurality of forward direction path probability calculation units the number of which is less than the number of said likelihood ratio calculation units, and a plurality of backward direction path probability calculation units the number of which is less than the number of said likelihood ratio calculation units;

said likelihood ratio calculation units calculate in parallel the likelihood ratio for each of a plurality of data blocks;

said forward direction path probability calculation units time-divisionally calculate probabilities of said forward direction paths for said data blocks; and said backward direction path probability calculation units time-divisionally calculate probabilities of said backward direction paths for said data blocks.

2. An information recording and reproduction apparatus having a turbo decoder that decodes turbo encoded data, wherein said turbo decoder has a plurality of likelihood ratio calculation units and a plurality of forward direction path probability calculation units the number of which is less than the number of said likelihood ratio calculation units;

said likelihood ratio calculation units calculate in parallel the likelihood ratio for each of a plurality of data blocks; and said forward direction path probability calculation units time-divisionally calculate probabilities of said forward direction paths for said data blocks.

3. An information recording and reproduction apparatus having a turbo decoder that decodes turbo encoded data, wherein said turbo decoder has a plurality of likelihood ratio calculation units and a plurality of backward direction path probability calculation units the number of which is less than the number of said likelihood ratio calculation units;

said likelihood ratio calculation units calculate in parallel the likelihood ratio for each of a plurality of data blocks; and said backward direction path probability calculation units time-divisionally calculate probabilities of said backward direction paths for said data blocks.

4. An information recording and reproduction apparatus having a turbo decoder that decodes turbo encoded data, wherein said turbo decoder has a plurality of likelihood ratio calculation units, a plurality of forward direction path probability calculation units the number of which is less than the number of said likelihood ratio calculation units, a plurality of backward direction path probability calculation units the number of which is less than the number of said likelihood ratio calculation units, a plurality of forward direction path probability memory units that store calculation results calculated by said forward direction path probability calculation units, and a plurality of backward direction path probability memory units that store calculation results calculated by said backward direction path probability calculation units;

said likelihood ratio calculation units calculate in parallel the likelihood ratio for each of a plurality of data blocks;

said forward direction path probability calculation units time-divisionally calculate probabilities of said forward direction paths for said data blocks;

said backward direction path probability calculation units time-divisionally calculate probabilities of said backward direction paths for said data blocks;

said forward direction path probability memory units time-divisionally store said probabilities of said forward direction paths for each of said data blocks time-divisionally calculated by said forward direction path probability calculation units; and said backward direction path probability memory units time-divisionally store said probabilities of said backward direction paths for each of said data blocks time-divisionally calculated by said backward direction path probability calculation units.

5. An information recording and reproduction apparatus having a turbo decoder that decodes turbo encoded data, wherein said turbo decoder has a plurality of likelihood ratio calculation units, a plurality of forward direction path probability calculation units the number of which is less than the number of said likelihood ratio calculation units, and a plurality of forward direction path probability memory units which store calculation results calculated by said forward direction path probability calculation units;

said likelihood ratio calculation units calculate in parallel the likelihood ratio for each of a plurality of data blocks;

said forward direction path probability calculation units time-divisionally calculate probabilities of said forward direction paths for said data blocks; and said forward direction path probability memory units time-divisionally store said probabilities of said forward direction paths for each of said data blocks time-divisionally calculated by said forward direction path probability calculation units.

6. An information recording and reproduction apparatus having a turbo decoder that decodes turbo encoded data, wherein said turbo decoder has a plurality of likelihood ratio calculation units, a plurality of backward direction path probability calculation units the number of which is less than the number of said likelihood ratio calculation units, and a plurality of backward direction path probability memory units that store calculation results calculated by said backward direction path probability calculation units;

said likelihood ratio calculation units calculate in parallel the likelihood ratio for each of a plurality of data blocks;

said backward direction path probability calculation units time-divisionally calculate probabilities of said backward direction paths for said data blocks; and said backward direction path probability memory units time-divisionally store said probabilities of said backward direction paths for each of said data blocks time-divisionally calculated by said backward direction path probability calculation units.

7. An optical disk apparatus having a turbo decoder that decodes turbo encoded data, wherein said turbo decoder has a plurality of likelihood ratio calculation units, a plurality of forward direction path probability calculation units the number of which is less than the number of said likelihood ratio calculation units, and a plurality of backward direction path probability calculation units the number of which is less than the number of said likelihood ratio calculation units;

said likelihood ratio calculation units calculate in parallel the likelihood ratio for each of a plurality of data blocks;

said forward direction path probability calculation units time-divisionally calculate probabilities of said forward direction paths for said data blocks; and said backward direction path probability calculation units time-divisionally calculate probabilities of said backward direction paths for said data blocks.

8. An optical disk apparatus having a turbo decoder that decodes turbo encoded data, wherein said turbo decoder has a plurality of likelihood ratio calculation units, a plurality of forward direction path probability calculation units the number of which is less than the number of said likelihood ratio calculation units, a plurality of backward direction path probability calculation units the number of which is less than the number of said likelihood ratio calculation units, a plurality of forward direction path probability memory units that store calculation results calculated by said forward direction path probability calculation units, and a plurality of backward direction path probability memory units that store calculation results calculated by said backward direction path probability calculation units;

said likelihood ratio calculation units calculate in parallel the likelihood ratio for each of a plurality of data blocks;

said forward direction path probability calculation units time-divisionally calculate probabilities of said forward direction paths for said data blocks;

said backward direction path probability calculation units time-divisionally calculate probabilities of said backward direction paths for said data blocks said forward direction path probability memory units time-divisionally store said probabilities of said forward direction paths for each of said data blocks time-divisionally calculated by said forward direction path probability calculation units; and said backward direction path probability memory units time-divisionally store said probabilities of said backward direction paths for each of said data blocks time-divisionally calculated by said backward direction path probability calculation units.

9. A data reproduction method for decoding turbo encoded data, said method comprising:

a step for calculating in parallel likelihood ratios for a plurality of data blocks;

a step for time-divisionally calculating probabilities of forward direction paths for each data block of the data blocks processed in parallel; and a step for time-divisionally calculating probabilities of backward direction paths for each data block of the data blocks processed in parallel.

10. An information recording and reproduction apparatus having a turbo decoder that decodes turbo encoded data, the turbo decoder comprising:

a plurality of likelihood ratio calculation units to calculate the likelihood ratio for each of a plurality of data blocks; and a plurality of direction path probability calculation units, the number of which is less than the number of said likelihood ratio calculation units, to calculate probabilities of forward and/or backward direction paths for said data blocks on a time-division basis.

* * * * *

UNITED STATES PATENT AND TRADEMARK OFFICE
CERTIFICATE OF CORRECTION

| | | |
|---|---|---|
| PATENT NO. | : 7,180,843 B2 | Page 1 of 1 |
| APPLICATION NO. | : 10/340752 | |
| DATED | : February 20, 2007 | |
| INVENTOR(S) | : Satoshi Furuta et al. | |

It is certified that error appears in the above-identified patent and that said Letters Patent is hereby corrected as shown below:

Column 15, Line 31, after "blocks" insert --;--.

Signed and Sealed this

Twenty-sixth Day of June, 2007

JON W. DUDAS
*Director of the United States Patent and Trademark Office*